United States Patent
Bindig et al.

(10) Patent No.: US 6,731,050 B2
(45) Date of Patent: May 4, 2004

(54) PIEZOCERAMIC MULTILAYER ACTUATORS AND A PROCESS FOR THEIR MANUFACTURE

(75) Inventors: Reiner Bindig, Bindlach (DE); Hans-Jürgen Schreiner, Neunkirchen am Sand-Rollhofen (DE)

(73) Assignee: CeramTec AG Innovative Ceramic Engineering, Plochingen (DE)

( * ) Notice: Subject to any disclaimer, the term of this patent is extended or adjusted under 35 U.S.C. 154(b) by 73 days.

(21) Appl. No.: 10/081,927

(22) Filed: Feb. 21, 2002

(65) Prior Publication Data

US 2002/0158551 A1 Oct. 31, 2002

(30) Foreign Application Priority Data

Mar. 6, 2001 (DE) .......................................... 101 10 617
Feb. 13, 2002 (DE) .......................................... 102 06 115

(51) Int. Cl.[7] .............................................. H01L 41/08
(52) U.S. Cl. ...................... 310/366; 310/328; 310/364; 29/25.35
(58) Field of Search ................................ 310/328, 363, 310/364, 365, 366; 29/25.35

(56) References Cited

U.S. PATENT DOCUMENTS

| | | | | |
|---|---|---|---|---|
| 5,237,239 A | * | 8/1993 | Inoue et al. ................. | 310/328 |
| 5,389,851 A | * | 2/1995 | Kimura et al. ............... | 310/340 |
| 5,406,164 A | * | 4/1995 | Okawa et al. ............... | 310/366 |
| 6,452,308 B1 | * | 9/2002 | Heinz et al. ................. | 310/328 |
| 6,452,312 B1 | * | 9/2002 | Hanaki et al. ............... | 310/364 |
| 6,462,464 B2 | * | 10/2002 | Mitarai et al. ............... | 310/366 |

\* cited by examiner

*Primary Examiner*—M. Budd
(74) *Attorney, Agent, or Firm*—Fulbright & Jaworski L.L.P.

(57) ABSTRACT

During operation, large tensile stresses act on the insulating region under the base metallization with external electrodes on piezoceramic multilayer actuators. Since this insulating region forms a homogeneous unit together with the base metallization and the interconnecting layer, this fails when the tensile strength of the weakest element is exceeded and cracks develop. The cracks running unchecked through the insulating region are very critical, since they reduce the insulation distance and seriously increase the probability of actuator failure due to flashovers.

According to the invention it is therefore proposed that, in the inactive region (14), the surface (10) of the multilayer actuator (1) has a pattern (18) that is produced by erosions (19) interrupting the surface (10), and that the base metallization (11) is deposited exclusively on the surface (10) left by the pattern (18).

26 Claims, 3 Drawing Sheets

PIEZOCERAMIC MULTILAYER ACTUATORS AND A PROCESS FOR THEIR MANUFACTURE

The invention concerns piezoceramic multilayer actuators and a process for their manufacture.

Piezoceramic multilayer actuators are manufactured as monoliths, that is to say the active material onto which internal electrodes are deposited by a silk screen process prior to sintering, is disposed as a so-called green film in successive layers as a stack that is compressed into a green body. The compression of the green body is usually carried out by lamination in laminating moulds under the action of pressure and temperature.

A piezoceramic multilayer actuator 1 manufactured in this manner is shown schematically and much enlarged in FIG. 1. The actuator consists of stacked thin layers 2 of piezoelectrically active material, for example lead zirconate titanate (PZT), with conductive internal electrodes 3 disposed between said layers and which are led out alternately at the surface of the actuator. External electrodes 4, 5 connect the internal electrodes 3. As a result, the internal electrodes 3 are electrically connected in parallel and combined into two groups. The two external electrodes 4, 5 are the connecting poles of the actuator 1. They are connected via the connections 6 to a voltage source, not shown here. If an electrical voltage is applied via the connections 6 to the external electrodes 4, 5, this electrical voltage is transmitted in parallel to all internal electrodes 3 and produces an electric field in all layers 2 of the active material, which is consequently mechanically deformed. The sum of all of these mechanical deformations is available at the end faces of the head region 7 and the foot region 8 of the multilayer actuator 1 as a useable expansion and/or force 9.

FIG. 2 shows a section through the external electrode 4 and the surface of the piezoceramic multilayer actuator 1 according to the prior art. The structure of the external electrode can be seen in this Figure. In the region where the internal electrodes 3 are led out at the surface 10 of the multilayer actuator 1, a base metallisation 11 for connecting the internal electrodes 3 of identical polarity is deposited on the thin layers 2 of the piezoelectrically active material compressed into a stack, for example by means of an electroplating process or silk-screening of metal paste. This base metallisation 11 is reinforced by a further layer 12 of a metallic material, for example by a structured sheet or a wire mesh. The connection of the reinforcing layer 12 with the base metallisation 11 is achieved by means of an interconnecting layer 13, usually a solder layer. An electrical connecting wire 6 is soldered to the reinforcing layer 12.

External electrodes on the surface 10 of an actuator 1, which are constructed as described, have a serious drawback. During operation, large tensile stresses act upon the inactive region, the insulating region 14 that lies under the base metallisation 11. Since this insulating region 14 forms a homogeneous unit together with the base metallisation 11 and the interconnecting layer 13, this fails when the tensile strength of the weakest element is exceeded and cracks develop. The described crack progression occurs after about $10^6$ load cycles. Because of the stresses occurring, the cracks 15 usually run from the brittle and low tensile strength base metallisation 11 into the insulating region 14 and are trapped therein by regions with high tensile stresses, preferably at the electrode points 16 of the electrodes 3 not in contact with the base metallisation 11, or they start in the regions of maximum tensile stress at the electrode points 16 and run in the direction of the base metallisation 11. The propagation of a crack 17 along the internal electrode 3 contacting the base metallisation 11 is classified as non-critical since such a crack progression does not impair the operation of the actuator. On the other hand, cracks 15 which run unchecked through the insulating region 14 are very critical since they reduce the insulation distance and seriously increase the probability of actuator failure due to flashovers.

Solutions to problems are described, for example, in the patent applications DE 198 60 001 A1, DE 394 06 19 A1, DE 196 05 214 A1. Here it is proposed that the region between an electrode not contacting the base metallisation and the base metallisation, be provided with a filler material of low tensile strength, or a hollow space. The main disadvantages of this procedure to be considered here are that the filler material must be introduced by means of an additional, complex process step, that the filler material inevitably has a negative effect on the properties of the actuator and, in the case of the hollow spaces introduced, these have to be re-closed in a further process step prior to the deposition of the base metallisation.

Another solution to the problem is proposed in DE 199 28 178 A1. Here the monolithic construction is split into small partial regions and reconstructed with alternating, inactive, electrode-free regions. By doing this, the maximum possible tensile stress within an active region is intended to remain below the value necessary for crack formation. From a manufacturing standpoint, the process is difficult and does not result in the necessary reduction in stresses in the isolating region, so that there is always a potential risk of cracking.

The object of the invention is to design the multilayer actuators so that the causes leading to crack formation in the multilayer actuators are avoided as far as possible.

The object is achieved in that a pattern is produced on the surface of the inactive region, the insulating region, by erosions interrupting the surface. The base metallisation is deposited exclusively on the surface left by the pattern. As a result, the external electrode is not connected to the entire surface of the multilayer actuator thus reducing the stiffness of the composite structure, comprising the surface of the isolating region, the base metallisation, the interconnecting layer and the reinforcing layer. The effect of the patterning is that the mechanical repercussions of the external electrode on the actuator is reduced. The tensile stresses occurring in the isolating region can no longer add up to a critical value exceeding the strength of the ceramic material and causing cracks.

An optimum effect is obtained if the depth of the erosions at the surface of the actuator producing the pattern corresponds to the thickness of the insulating region. The material of the insulating region is continuously interrupted so that stresses occurring cannot be transferred and as a consequence cannot add up to a critical value. The thickness of the isolating region depends, among other things, on the size of the actuator. Where the thickness of the insulating region is fully utilised, the depth of the structure, the depth of the erosions, can be up to about 0.5 mm.

The pattern can be applied to an actuator both in the green state and in the sintered state. Processing in the green state is the most advantageous one because, due to the softer ceramic material, it causes less tool wear and may also be carried out with processes other than the usual grinding process. A further advantage is that the sinter skin produced during sintering covers and isolates the structure deposited in the green body. As a result, the structure is reliably protected against electrical flashovers and moisture.

The interruption of the surface of the insulating region by erosions, in particular in the green state, can easily be effected by any machine cutting process. When an actuator is in the sintered state, in addition to grinding, machining with a suitable laser also presents itself. The surface processed by grinding after sintering must of course be subsequently insulated, for example by a polymer material.

The simplest erosion of the surface is the incorporation of linear structures, in particular grooves in the form of channels or notches, because they are also suitable for a specific structuring of relatively large areas. In this case the grooves can run in parallel.

The width of a groove, the spacing between two grooves and the angle of these grooves with respect to the longitudinal axis of the actuator must be matched to one another, so that no more than a predetermined number of internal electrodes occurs between two grooves at the surface of the actuator. This maximum number depends on the specific expansion of the actuator in operation and the strength of the ceramic material. The grooves can be disposed at a spacing of 0.2 mm to 10 mm and adjusted to the size of the actuator. A spacing of approximately five layers of internal electrodes or a spacing of approximately 0.8 mm to 1.2 mm between two grooves has proved particularly suitable. If the number of internal electrodes is made too high, the tensile stresses add up from electrode to electrode and exceed the critical value, this leading to the formation of cracks.

The grooves can be disposed at an angle of 0 degrees to 80 degrees to the longitudinal axis of the actuator. At 0 degrees the grooves run parallel to the longitudinal axis of the actuator. A range of 50 degrees to 30 degrees is advantageous. If 45° is chosen as the angle of intersection, for example, then a favourable parameter is a spacing between two grooves of approximately 0.7 mm and a groove width of approximately 1 mm/√2.

DETAILED DESCRIPTION

Figure 1:
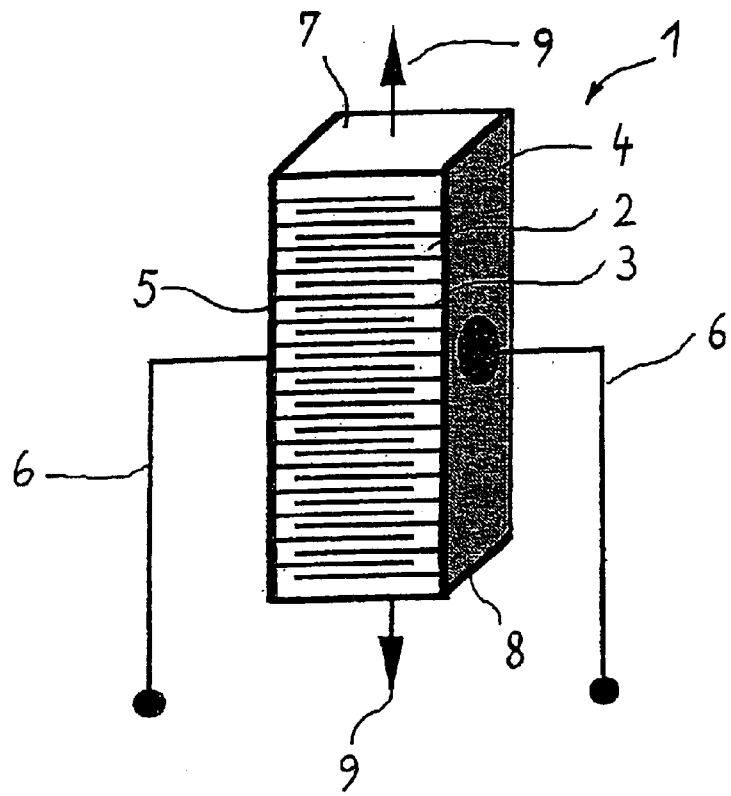
FIG. 1 is an enlarged drawing of a piezoceramic multilayer activator manufactured as a monolith according to the prior art.
Figure 2:
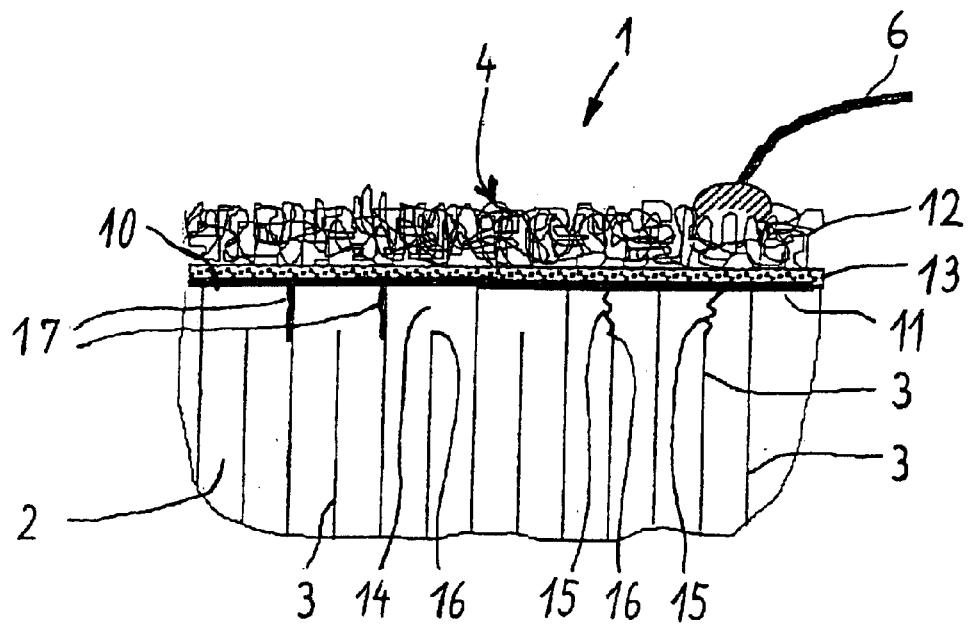
FIG. 2 shows a section through the external electrode and the surface of a piezoceramic multilayer actuator according to the prior art.
Figure 3:
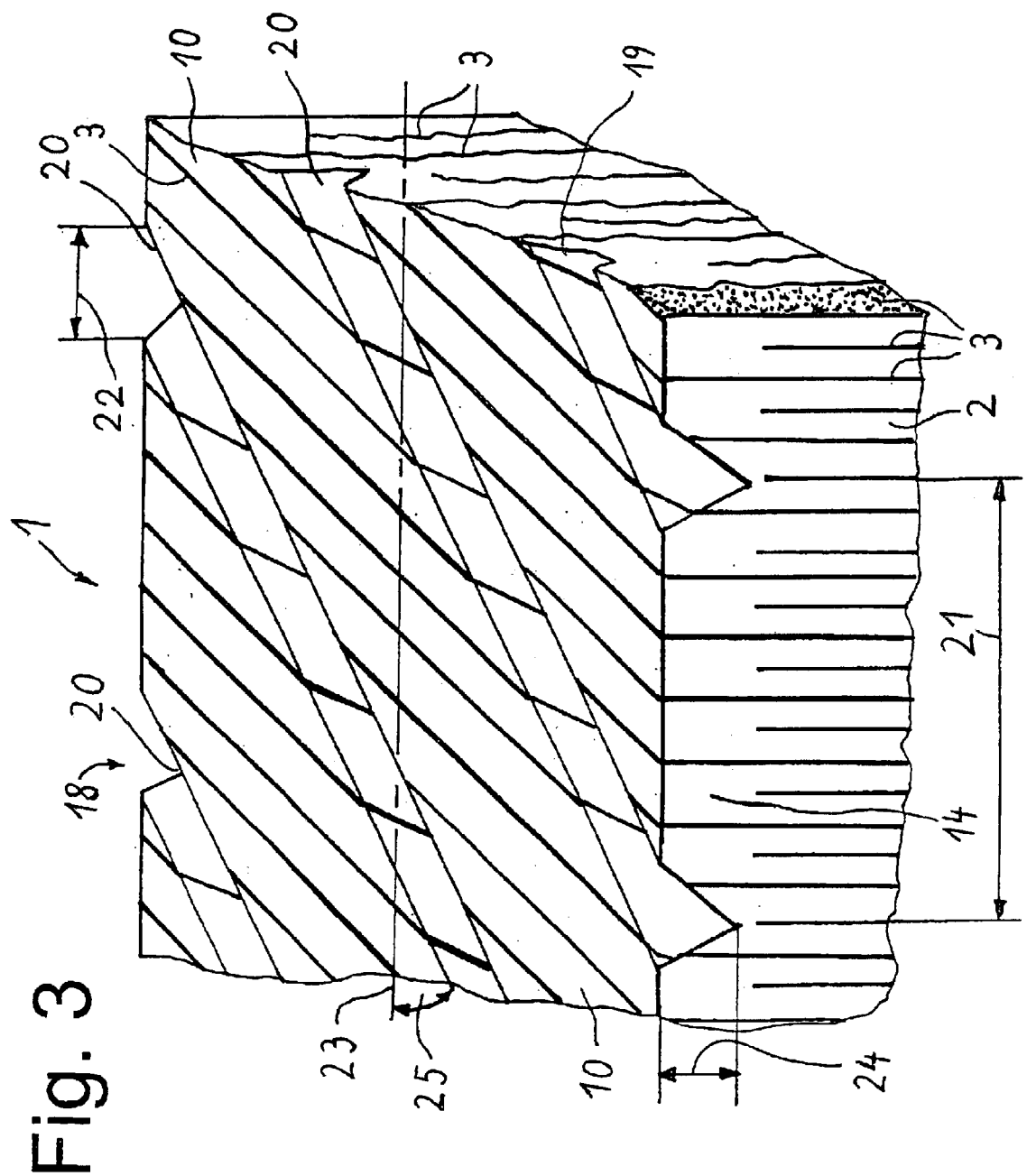
FIG. 3 is a perspective sectional view of a multilayer actuator according to the present invention.
Figure 5:
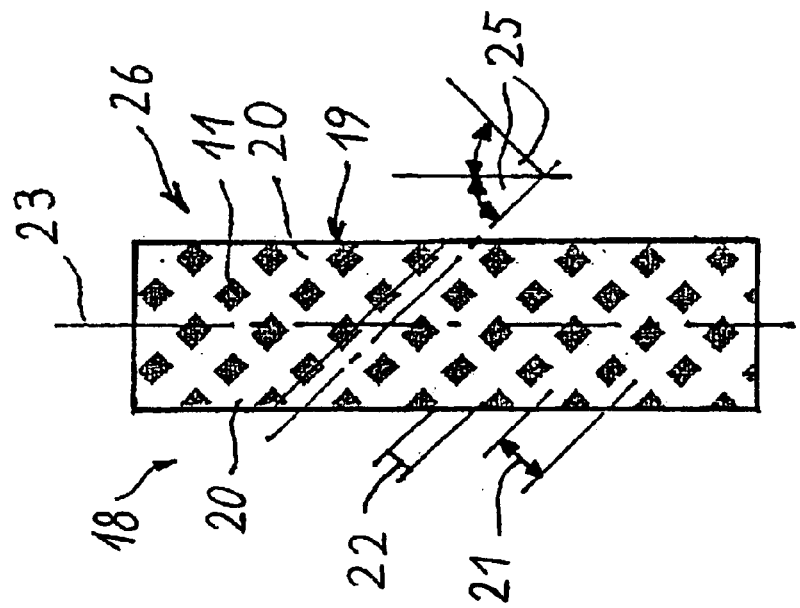
FIG. 5 shows the surface of an alternative embodiment of an actuator prepared according to the present invention.
Figure 4:
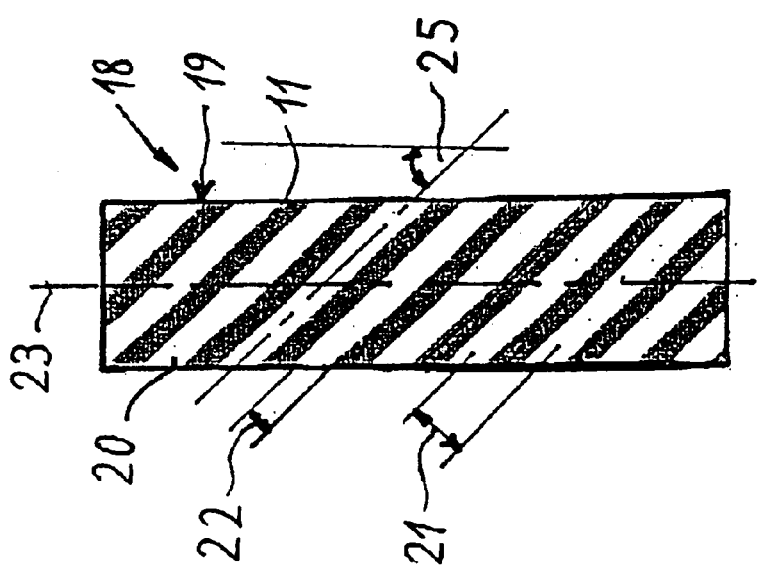
FIG. 4 is a view showing milled grooves resulting interruptions in the surface of an actuator according to the present invention.

The manufacture of a multilayer actuator according to the invention is described by way of example with the aid of FIGS. 3, 4 and 5. A piezoceramic material with a low degree of sintering, for example SKN53 disclosed in DE 198 40 488 A1, is prepared with an organic binder as a 125 μm thick green film. A paste for forming an internal electrode and made from silver palladium powder with a component weight ratio of 70/30 and a suitable binder is applied to this green film by silk screening. A number of such green films is stacked into a block and laminated under known pressure and temperature conditions. The individual rod-shaped actuators are separated out from the laminate.

According to the invention, as shown in a perspective sectional view in FIG. 3, grooves 20 are then milled by a machine cutting process, for example with a disc milling cutter, to such a depth 24 that the inactive insulating region 14 completely penetrates the surface 10 of each individual multilayer actuator 1 on the sides to be contacted, at a suitable angle 25 to the longitudinal axis 23 of the actuator 1. The milling of the grooves 20 is repeated at regular distances 21. The resulting interruptions 19 in the surface 10 of the actuator form a structuring 18 in the form of parallel stripes, as illustrated in FIG. 4.

Here the width 22 of a groove 20, the spacing 21 between two grooves 20 and the angle 25 of the grooves 20 to the longitudinal axis 25 are set with respect to one another so that no more than five internal electrodes 3 occur between two grooves 20 at the surface 10 of the actuator. FIG. 3 shows the non-metallised surface 10 of the actuator, on which the course of the internal electrodes 3 appearing at the surface 10, together with the course of the grooves 20, can be followed.

As can be seen in FIG. 4, the base metallisation 11 consisting of a firing paste containing silver is deposited by means of a printing process on the surface 10 of the actuator 1 left by the patterning 18. After the base metallisation 11 is fired, the external electrodes are completed by a metal wire mesh soldered thereon.

FIG. 5 shows the surface 10 of an actuator 1, that has been prepared according to the process described above. Its patterning 18 consists of crossing grooves 20. Each of these cuts the longitudinal axis 23 of the actuator at an angle 25 and they thus form a grid pattern 26. Here too only the base metallisation 11 is first deposited on the surface 10 of the actuator, that is left by the erosions, the grooves 20.

The actuators prepared in such a way in the green state are pyrolyzed at around 400° C. and sintered at around 1100° C.

It is proved by means of the following exemplifying embodiments that the cause of crack formation in multilayer actuators is eliminated by the invention.

As a first variant in accordance with the process described above, basic actuator bodies were manufactured as green bodies with a cross-sectional area of 12.50 mm×12.50 mm and a length of 37.50 mm. The thickness of a single ceramic layer, a green film, was 125 μm, the thickness of the metallisation layer of the internal electrode being 3 μm. This practical variant serves as a reference model and represents the prior art.

As a second variant in accordance with the process described above, basic actuator bodies were manufactured as green bodies with a cross-sectional area of 12.50 mm×12.50 mm and a length of 37.50 mm. The thickness of a single ceramic layer, a green film, was 125 μm, the thickness of the metallisation layer of the internal electrode being 3 μm. The basic actuator bodies were milled at regular distances with a disc milling cutter with a cutting width of 0.7 mm at an angle of 45° to the longitudinal axis of the actuator on the sides to be contacted to an external electrode. At 0.5 mm, the depth of the grooves corresponded to the thickness of the insulating region. The spacing between each of the grooves was 0.7 mm.

As a third variant in accordance with the process described above, basic actuator bodies were manufactured as green bodies with a cross-sectional area of 12.50 mm×12.50 mm and a length of 37.50 mm. The thickness of a single ceramic layer, a green film, was 125 μm, the thickness of the metallisation layer of the internal electrode being 3 μm. The basic actuator bodies were milled at regular distances with a disc milling cutter with a cutting width of 0.2 mm at an angle of 90° to the longitudinal axis of the actuator on the sides to be contacted. At 0.5 mm, the depth of the grooves corresponded to the thickness of the insulating region. The spacing between each of the grooves was 1.0 mm. The course of the grooves in this test did not correspond to the course provided for in practice since a number of internal electrodes, dependent upon the groove width, that were brought out at the surface, were milled away and not connected to the external electrode. The groove progression was chosen because the grooves act like notches and therefore, during the longitudinal expansion of an actuator, have the most unfavourable effect on its tensile strength. The effects which could have caused possible additional cracks on the surface structure had to be checked.

As a fourth variant in accordance with the process described above, a body was manufactured as a green body with a cross-sectional area of 100 mm×12.50 mm and a length of 37.50 mm, which after the production of the structure, was separated into eight individual rod-shaped basic actuator bodies. The thickness of a single ceramic layer, a green film, was 125 $\mu$m, the thickness of the metallisation layer of the internal electrode being 3 $\mu$m. The actuator bars were milled at regular distances with a disc milling cutter with a cutting width of 0.7 mm at an angle of 45° to the longitudinal axis of the actuator on the sides to be contacted. At 0.5 mm, the depth of the grooves corresponded to the thickness of the isolating region. The spacing between each of the grooves was 0.7 mm.

The basic actuator bodies of the above four exemplifying embodiments were pyrolized at around 400° C. and then sintered at around 1100° C.

As a fifth variant in accordance with the process described above, basic actuator bodies were manufactured as green bodies with a cross-sectional area of 12.50 mm×12.50 mm and a length of 37.50 mm. The thickness of a single ceramic layer, a green film, was 125 $\mu$m, the thickness of the metallisation layer of the internal electrode being 3 $\mu$m. The basic actuator bodies were pyrolized and sintered. Only after this were cuts with a width of 0.2 mm milled with a diamond saw at regular distances on the sides to be contacted, at an angle of 45° to the longitudinal axis of the actuator. At 0.4 mm, the depth of the grooves corresponded to the thickness of the isolating region. The spacing between the grooves was 0.6 mm. After careful cleaning, the grooves were filled with a silicone resin. The resin was hardened at 140° C.

With the multilayer actuators of the above five variants the contact sides for connecting the external electrodes and the end faces of the head and foot regions were machined by grinding. The sinter skin remained on the remaining sides as an isolating layer.

After sintering, the external electrodes, which consisted of a wire mesh, were soldered to the five variants of the actuator body by a known process. The material of the mesh was a material of similar thermal expansion coefficient to the ceramic material for example, $FeNi_{36}$. The wire diameter was 100 $\mu$m, the mesh size 200 $\mu$m. The mesh was pre-galvanized, for example copper plated, to provide solderability. $SnAg_4$ was used as solder. The soldering time was 2 minutes at 240° C.

The multilayer actuators produced in this way were cleaned and insulated with a suitable lacquer. After the soldering of the connecting leads to the electrode mesh, the actuators were prestressed in test frames at 2000 N and triggered by a trapezoidal signal. In this case the trigger voltage was increased from 0 V to 200 V in 100 $\mu$s, maintained at 200 V for 1 ms and then reduced to 0 V in 100 $\mu$s. The repetition frequency was 200 Hz. In the course of this the actuators reached operating temperatures of 150 to 160° C.

The first variant, as prior art, showed appreciable and serious crack formation at $10^6$ cycles. The cracks cut through the isolating zone in every direction, fewer cracks appeared along the internal electrodes.

Variants two to five showed virtually identical behaviour, which clearly differed from that of the first variant. No cracks appeared in the actuators, even after $10^8$ cycles.

What is claimed is:

1. Piezoceramic multilayer actuator with internal electrodes led out alternatingly to opposite surfaces of the actuator, which internal electrodes are interconnected on the respective surface of each by an external electrode, which consists of at least one layer of a base metallisation deposited on the inactive region of the actuator, by means of which base metallisation a reinforcing layer is connected by means of an interconnecting layer, to which reinforcing layer a connection to a voltage source can be soldered, characterized in that the surface of the multilayer actuator has a structure in the inactive region that is produced by erosions interrupting the surface, and that the base metallisation is deposited exclusively on the surface left by the structure.

2. Piezoceramic multilayer actuator according to claim 1, wherein the depth of the erosions producing the structure corresponds to the thickness of the insulating region at the surface of the actuator.

3. Piezoceramic multi layer actuator according to claim 1, wherein the depth of the structure is up to approximately 0.5 mm.

4. Piezoceramic multilayer actuator according to claims 1, wherein the erosions of the surface of the actuator, producing the structure consist of grooves.

5. Piezoceramic multilayer actuator according to claim 4, wherein the grooves are disposed parallel to one another.

6. Piezoceramic multilayer actuator according to 4, wherein the width of a groove, the spacing between two grooves and the angle of these grooves with respect to the longitudinal axis of the actuator are adjusted with respect to one another so that no more than a predetermined number of internal electrodes occurs between two grooves at the surface of the actuator.

7. Piezoceramic multilayer actuator according to claim 4, wherein the width of the grooves is 0.2 mm to 2 mm, preferably 0.2 mm to 0.7 mm.

8. Piezoceramic multilayer actuator according to claim 4, wherein the grooves are disposed at a spacing of 0.2 mm to 10 mm.

9. Piezoceramic multilayer actuator according to claim 6, wherein the optimum number of internal electrodes that occurs between two grooves at the surface of the actuator is approximately five and thus the spacing of the grooves between one another is approximately 0.8 mm to 1.2 mm.

10. Piezoceramic multilayer actuator according to claim 4, wherein the grooves run at an angle of 0 degrees to 80 degrees, preferably from 30 degrees to 50 degrees, to the longitudinal axis of the actuator.

11. Piezoceramic multilayer actuator according to claim 4, wherein the structure is a grid of crossing grooves.

12. Piezoceramic multilayer actuator according to claim 1, wherein the structure is produced by a machine cutting process.

13. Piezoceramic multilayer actuator according to claim 1, wherein the structure is produced by a laser process.

14. Piezoceramic multilayer actuator according to claim 1, wherein the structure is incorporated in the surface in the green state of the actuator.

15. Piezoceramic multilayer actuator according to claim 1, wherein the structure is incorporated in the surface in the sintered state of the actuator.

16. Process for the manufacture of a piezoceramic multilayer actuator according to claim 1, wherein a structure is produced on the surface of the inactive region of the actuator by erosions in the surface, and that for connecting the internal electrodes, the base metallisation is deposited exclusively on the surface left by the structure.

17. Process according to claim 16, wherein to produce the structure, the surface is eroded to a thickness that corresponds to the thickness of the isolating region.

18. Process according to claim 16, wherein grooves are produced in the surface of the actuator.

19. Process according to claim 18, wherein the grooves are disposed in parallel.

20. Process according co claim 18, wherein the width of a groove, the spacing between two grooves and the angle of these grooves with respect to the longitudinal axis of the actuator are adjusted with respect to one another so that no more than a predetermined number of internal electrodes occur between two grooves at the surface of the actuator.

21. Process according to claim 20, wherein the number of internal electrodes that occurs between two grooves in the surface of the actuator is set at five.

22. Process according to claim 18, wherein the grid structure is produced by crossing grooves.

23. Process according to claim 16, wherein the structure is produced by a machine cutting process.

24. Process according to claim 16, wherein the structure is produced by a laser process.

25. Process according to claim 16, wherein the structure is produced in the green state of the actuator.

26. Process according to claim 16, wherein the structure is produced in the sintered state of the actuator.

* * * * *